United States Patent [19] [11] 3,915,767
Welliver [45] Oct. 28, 1975

[54] RAPIDLY RESPONSIVE TRANSISTOR WITH NARROWED BASE

[75] Inventor: Lawrence C. Welliver, Wayzata, Minn.

[73] Assignee: Honeywell Inc., Minneapolis, Minn.

[22] Filed: Feb. 5, 1973

[21] Appl. No.: 329,795

[52] U.S. Cl. ................ 148/190; 148/188; 148/187; 357/31
[51] Int. Cl.² ................ H01L 7/34
[58] Field of Search ................ 148/190, 188, 187; 317/235 WN

[56] References Cited

UNITED STATES PATENTS

| | | | |
|---|---|---|---|
| 3,660,156 | 5/1972 | Schmidt | 148/188 X |
| 3,664,896 | 5/1972 | Duncan | 148/190 X |
| 3,673,471 | 6/1972 | Klein et al. | 317/235 B |
| 3,753,807 | 8/1973 | Hoare et al. | 148/188 |
| 3,759,762 | 9/1973 | Barone et al. | 148/187 |
| 3,765,963 | 10/1973 | Okabe et al. | 148/188 |

*Primary Examiner*—G. Ozaki
*Attorney, Agent, or Firm*—Theodore F. Neils

[57] ABSTRACT

Bipolar transistors having a narrowed base under the emitter regions are disclosed for use in fast responding circuits. The narrow base region under the emitter region is obtained during simultaneous diffusion of both regions. Further steps provide a transistor with a small, heavily doped emitter that is conveniently formed in monolithic integrated circuits.

38 Claims, 6 Drawing Figures

RAPIDLY RESPONSIVE TRANSISTOR WITH NARROWED BASE

BACKGROUND OF THE INVENTION

This invention relates to a method for conveniently making rapidly responsive bipolar transistors and to devices made by this method.

Signal processing circuits which require the active devices used therein to rapidly switch between voltage levels are already widely used and new applications are increasing because of several advantages in signal processing by use of such circuits. Bipolar transistors are important active devices for use in such circuits because of their ability to rapidly respond to input signals. Therefore considerable effort has been expended to design and make bipolar transistors which have an output response following as fast as possible upon signal variations being applied to the transistor input.

Several parameters used to characterize bipolar transistors are known to affect the rapidity of bipolar transistor response to input signals. Among these are the base width of the transistor, the effective base resistance, the effective emitter resistance and the junction capacitances. Minimizing all of these shortens the delay time of the response of a bipolar transistor to an input signal voltage level shift. The value of these parameters depends primarily on the doping levels in the various regions of the transistor and the physical size of these regions. Thus the operationally effective portions of these transistor regions should generally be kept as small as possible and the doping levels in these regions should be kept high where feasible.

Several difficulties arise in attempting to make operationally effective transistor regions which are very small. Base width is difficult to control for in many manufacturing methods the emitter diffusion tends to push out the base regions. A narrow base region results in a high base resistance in that region because the doping level which can be used is limited. It is difficult to make an ohmic contact to a shallow, small emitter in many manufacturing methods because of registration difficulties and the chance of alloying through the emitter region.

These difficulties have been overcome to some extent. The use of arsenic as the impurity dopant for the formation of emitter regions with certain diffusion techniques has been found to result in a negligible emitter push out effect. Two base diffusions, one for a thin portion base region and another for a thick portion base region which intersects peripherally with the thin portion base region, minimizes base resistance. A polysilicon deposition which is used as a dopant source for the emitter diffusion can provide a self-registered contact for the emitter requiring no subsequent alloying to the emitter region to make a contact. However, better techniques to overcome these difficulties are desirable to provide an improved rapidly responsive bipolar transistor.

SUMMARY OF THE INVENTION

This invention is based on finding that a simultaneous diffusion of two different impurities into a semiconductor can result in one impurity having a limiting effect on the diffusion of the other. This limiting can be such that the limited impurity diffusion is not only prevented from being subject to the push out effect mentioned above, but diffusion of the limited impurity can even be kept behind the diffusion of the same limited impurity in other, adjacent locations not affected by the limiting impurity. The result achieved in the simultaneous diffusion depends on the type of and the surface orientation of the semiconductor material diffused into as well as on the impurity diffusants.

Thus a bipolar transistor can be made in a single major diffusion step wherein the base region will be substantially thinner in the immediate vicinity of the emitter than it is in other portions of the base region. A pinch resistor can be similarly made in a region similar to such a base region.

A bipolar transistor as above can conveniently be made by providing a polysilicon emitter contact, properly doped, as the emitter impurity diffusant source. In this way, neither the surface of the emitter nor transistor surface portions where intersected by junctions need be exposed to an atmosphere after the major diffusion step. Polysilicon may be used also as a low valued resistor provided in the same process step as in the polysilicon contact. Providing a layer of phosphorous doped silicon dioxide, melted and resolidified, furnishes a smooth, insulating support layer for overlaying metallization to prevent breaks therein as well as a protective layer over doped polysilicon resistors where used. As an alternative, a spun-on silicon dioxide layer having a silicon dioxide deposition upon it can be provided in place of the resolidified phosphorous doped silicon dioxide layer.

DESCRIPTION OF THE PREFERRED EMBODIMENTS

Figure 1:
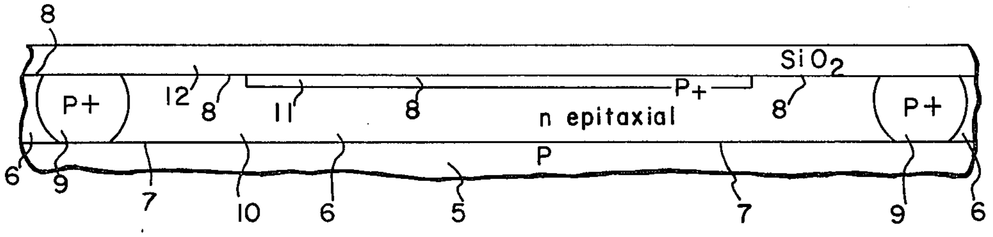
FIGS. 1 through 6 illustrate the results of various steps in the method of the invention with FIG. 6 showing a device resulting from the use of this method.

Referring to FIG. 1, a p type conductivity silicon substrate 5 is provided having epitaxially grown thereon an n type conductivity silicon epitaxial layer 6 with layer 6 having an outer major surface 8 and an inner major surface 7. A typical substrate will initially be in the vicinity of 14 mils thick and will be boron doped to have a resistivity usually from 2 to 8 ohm-cm. A typical epitaxial layer grown on such a substrate will be in the neighborhood of 4 to 5 microns thick and will be phosphorus doped to have a resistivity of somewhere around 0.35 ohm-cm. Isolation diffusion provides separating regions 9 of p+ type conductivity which serve to electrically isolate a region 10 from the remainder of epitaxial layer 6.

A transistor for rapid signal processing in an integrated circuit, as usually constructed, would be provided with an n+ type conductivity buried layer extending on either side of much of that portion of inner major surface 7 forming a boundary of isolated region 10. An n+ type conductivity sinker would provide a conduction path between the buried layer and outer major surface 8. Such a buried layer and sinker for the transistor constructed by the method below have been omitted from the figures to achieve simplicity.

The method of the invention proceeds with provision of a first diffusant, a p type conductivity diffusant, at a selected portion of that area of outer major surface 8 that is common to isolated region 10, i.e. the area of outer major surface 8 between the interior edges of isolation regions 9. The p type conductivity diffusant is provided at this selected area which is contained within the described common area. The base of a bipolar transistor is to be formed through this selected area.

A suitable procedure is to deposit and shallowly diffuse the first diffusant into the epitaxial layer 6 through outer major surface 8 in a short initial diffusion. Diffusing a substantial concentration of boron to provide a junction at less than 3,000 angstroms below outer major surface 8 by the use of well known methods is quite satisfactory. A surface concentration of boron of around $10^{20}$ atoms per cubic centimeter resulting from the initial diffusion has been found acceptable. The result is shown as initial diffusion region 11 in FIG. 1. The selected area mentioned above is the area of outer major surface 8 also belonging to diffused region 11 shown in FIG. 1.

A silicon dioxide layer 12 is deposited by a standard method on outer major surface 8. This deposition occurs after the initial diffusion and after stripping back from outer major surface 8 oxides remaining after completion of the initial diffusion. Outer major surface 8 has a portion thereof exposed, a portion contained within the selected area noted above, by removing silicon dioxide to provide an opening. This removal can be accomplished by the usual masking and etching techniques. The opening is labeled 13 in FIG. 2. The silicon dioxide layer 12 is to be used as a diffusion mask and must be undoped as well as relatively free of contaminants so as not to become a significant diffusion source itself in subsequent diffusion steps.

The opening 13 is made to provide an exposure of and so access to outer major surface 8 for a second diffusant. This second diffusant is to be simultaneously diffused with the first diffusant into isolated region 10. The second diffusant will form the emitter of the bipolar transistor and so it is required that the opening 13 be within the above selected area for the initial diffusion. This is required so that, after simultaneous diffusion, the base region separates the emitter and the collector.

For this last result to occur, it can be clearly seen that the first diffusant in initial diffusion region 11 must diffuse, in directions inward into isolated region 10, at a rate sufficiently rapid during simultaneous diffusion to convert a portion of isolated region 10 to a p type conductivity ahead of the diffusion of the second diffusant reconverting isolated region 10 to n type conductivity. This additional requirement is most stringent in the inward direction perpendicular to outer major surface 8 and becomes less stringent in inward directions more parallel to surface 8 since region 10 extends well beyond opening 13 in a direction parallel to surface 8.

Once the above condition on the relative rates of the diffusions of the first and second diffusants inwardly into the epitaxial layer is met and opening 13 is properly placed, the shape of the base region will be primarily determined by 1) the amount of difference in the rates of these diffusions given a substantial concentration of each diffusant initially, 2) the uniformity of the rapidness of diffusion of each diffusant at each point in the epitaxial layer and 3) by the amount of the selected area bounding initial diffusion diffusion 11 which is exposed by opening 13.

Arsenic is a n type impurity useful for constructing emitter regions. It is known that boron, the first diffusant used to form initial diffusion region 11, will generally diffuse inwardly into silicon faster than will arsenic.

Arsenic has been found to have the capability of limiting the rate of diffusion of boron at locations in doped silicon where both are in close proximity with one another during simultaneous diffusion inward into the silicon. The extent of the limiting effect appears to depend to a substantial extent on the orientation of the crystal plane being diffused into as well as on the character of the proximateness of the diffusants.

Thus, arsenic will limit the rapidness of boron diffusion into silicon across crystal planes of one orientation, when the diffusion of one of the two is for the most part not simultaneous with the other, such that negligible emitter push out will result from the arsenic also being diffused across those crystal planes. More importantly, in crystal planes of another orientation, arsenic will so limit the rapidness of simultaneously diffused boron across those planes in the vicinity of the arsenic that the boron diffusion there will fall behind the diffusion in the same direction of similar concentrations of boron in adjacent and similar locations in the silicon but where arsenic has not initially been introduced. In such adjacent locations the boron is not in close proximity to the arsenic as the simultaneous diffusion of the two proceeds into the silicon across crystal planes having this latter orientation. This latter orientation is the (100) orientation.

This type of limiting effect of arsenic on simultaneously diffused boron in this latter crystal plane orientation makes possible the formation of a transistor base region having a very narrow base width under an emitter formed with arsenic while being much wider in peripheral portions of the base region not under the emitter. With boron provided at a selected area of a silicon surface and arsenic provided at a portion of this selected area, the boron diffusing in directions substantially perpendicular to the silicon surface beneath the place the arsenic was provided will fall behind the boron diffusing in the same directions but not located beneath a place where arsenic was provided. Thereby the narrow base with a thicker peripheral region can be provided in a single major diffusion step.

In transistor operation, base current alone is conducted through these peripheral regions. The result is to lower the base resistance in the peripheral regions and so the total effective base resistance. Such a base region can also be made to serve instead as a pinch resistor with appropriate contacts to the silicon for external connection.

Figure 2:
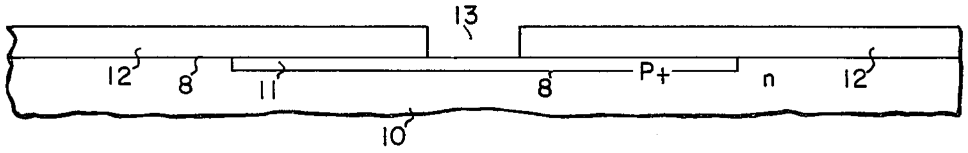

Since, from above, the crystal plane orientation is preferably the (100) orientation, outer major surface 8 of FIG. 1 is in the (100) orientation as it is in FIG. 2 and in the remaining figures. Arsenic is chosen as the second diffusant so that a base region of the form described above results from simultaneous diffusion. The preferred source for the second diffusant is an arsenic-doped polysilicon deposition provided in opening 13 as well as over silicon dioxide layer 12. Etched to a proper size, the remaining doped polysilicon can thereafter serve as an intermediate contact between the emitter and the metallization. By the use of such a doped polysilicon source the emitter need never be exposed to an atmosphere outside the semiconductor material after its formation. Further, the metallization network subsequently provided can form an ohmic contact with the polysilicon to avoid having to alloy to the emitter directly.

Figure 3:
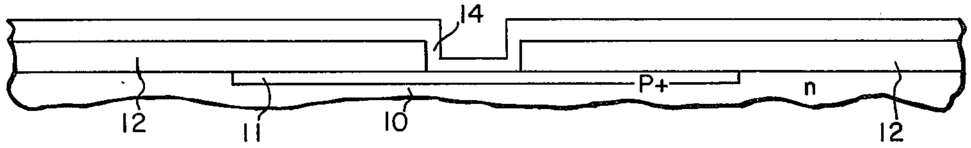

The result of the polysilicon deposition step is shown in FIG. 3 where an arsenic-doped polysilicon deposition 14 has been made in opening 13 on outer major surface 8 of FIG. 2 as well as on silicon dioxide layer 12. Such a doped polysilicon deposition can be provided by known methods. The arsenic concentration in the doped polysilicon should be such that the emitter surface concentration of arsenic at outer major surface 8 is around $10^{21}$ atmos per cubic centimeter after formation of the emitter by the diffusion step set out below. This high level of emitter impurity concentration will aid in providing a low effective emitter resistance.

Figure 4:
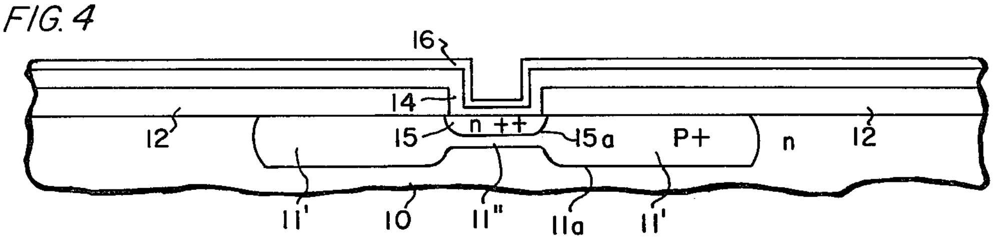

After the doped polysilicon deposition 14 has been applied, the first and second diffusants, boron and arsenic, are diffused together into isolated region 10 by heating to 1100°C for 30 minutes in the presence of oxygen with the result shown in FIG. 4. Remaining portions of isolated region 10, not having undergone a change in conductivity type through diffusion, will form part of the collector for the transistor. The initial diffusion region 11 of FIG. 3, after the simultaneous diffusion, becomes the base region 11' and 11'' of FIG. 4 because of the above described limiting effect of arsenic on the diffusion of boron in the (100) orientation. The base region has a very narrow width in the 11'' portion where the junction surface 11a, between the base region and the collector, closely approaches the junction surface 15*a* between the emitter region 15 and the base region. The base region is substantially wider in the 11' regions where there has been no close proximity of boron to arsenic while they are simultaneously diffusing into the silicon across crystal planes of (100) orientation. The silicon dioxide layer 12 is impervious to diffusion of arsenic through it from the overlaying doped polysilicon deposition.

During the diffusion heating step above, oxygen is introduced to provide a thermally grown silicon dioxide layer 16 of 1,000 angstroms or so on the doped polysilicon deposition layer 14. This thermally grown silicon dioxide layer is then selectively etched away in a standard manner to provide a mask for the subsequent etching away of portions of the doped polysilicon deposition layer to expose most of silicon dioxide layer 12. The exposed portions of the doped polysilicon layer are then etched away by known methods with the remainder being denoted 14' in FIG. 5.

A layer of phosphorus doped silicon dioxide 17 is then deposited on the exposed silicon dioxide 12 and on the remaining doped polysilicon 14' as still masked by the thermally grown silicon dioxide. This phosphorus doped silicon dioxide layer 17 is deposited at 400°C and is about 4,000-5,000 angstroms thick. Its purpose is to provide a smooth support surface for the metallization following in a subsequent step. To obtain the requisite smoothness the device is subjected to a 1,000°C temperature for a sufficient time to melt the phosphorus doped silicon dioxide layer 17 without significantly altering the underlying structure after which layer 17 is allowed to resolidify. Oxygen is introduced for a short time during the melting step to prepare the phosphorus doped silicon dioxide surface to accept photoresist.

A photoresist mask is then placed on the phosphorus doped silicon dioxide layer 17 in preparation for an etching step to provide openings therein to allow ohmic contacts to underlying structure. An opening must also be made in silicon dioxide layer 12 to expose outer major surface 8 within the selected area bounding what is now base region 11'. After these openings are made (leaving the phosphorus doped silicon dioxide layer 17 overlapping the edge areas of the remaining doped polysilicon 14'), metal is deposited to form emitter contact 18 and base contact 19 as shown in FIG. 6. The metal as deposited also forms a collector contact, not shown, to the above mentioned n+ type conductivity sinker which has been omitted from FIGS. 1 through 6 as stated earlier. Aluminum is a satisfactory metal for this deposition.

As an alternative to using the above layer of phosphorus doped silicon dioxide, a colloidal dispersion having silicon dioxide or a doped silicon dioxide suspended in an alcohol may be spun-on by usual methods to cover the exposed portions of silicon dioxide layer 12 and the doped polysilicon 14' remaining after the etching of the doped polysilicon 14 set out above. The alcohol is then evaporated away to leave a hard film of either silicon dioxide or doped silicon dioxide as chosed. The obtaining of the film from the dispersion can be aided by a low temperature bake such as by heating for an hour at 200°C. The resulting film will be 1000 to 1500 angstroms thick typically.

Figure 5:
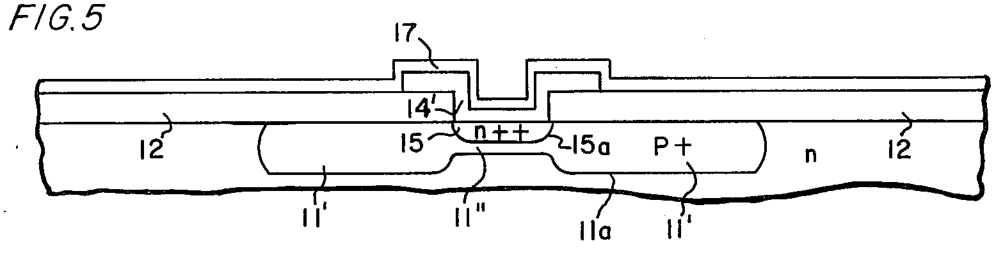
Figure 6:
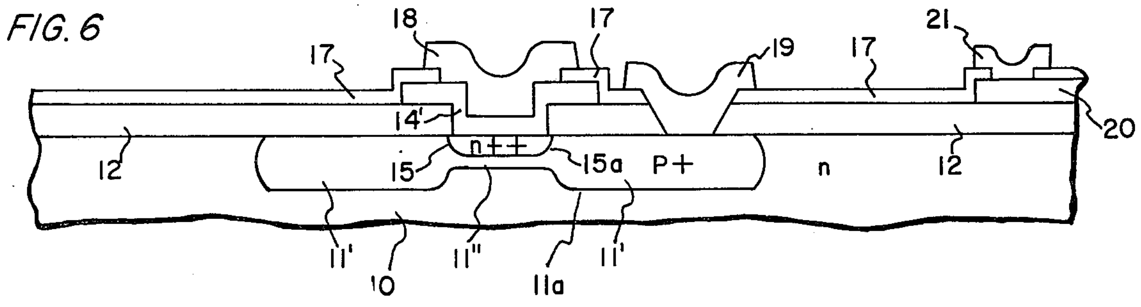

Silicon dioxide or doped silicon dioxide is then deposited on this film such that the film plus the deposited silicon dioxide together provide layer 17 of FIGS. 5 and 6. Phosphorus would be a useful dopant in the silicon dioxide. The device at this point in the processing is then annealed by placing it at 1000°C for around a half hour. The steps of opening layer 17 for metallization by photoresist masking and etching followed by the metallization proceeds as in the alternative phosphorus doped silicon dioxide layer situation described just above.

Also shown in FIG. 6 is a doped polysilicon deposition 20 to be used as a crossunder interconnection or as a low valued resistor. The doped polysilicon deposition 20 is deposited and etched in the same steps as doped polysilicon emitter contact 14'. A metallization contact 21 can be made through the doped polysilicon deposition 20 in the same manner as metallization emitter contact 18 is made to doped polysilicon emitter contact 14'.

In some applications it may be desirable to have a silicon nitride layer between silicon dioxide layer 12 and phosphorus doped silicon dioxide layer 17. Steps to implement such a silicon nitride layer based on standard methods can be added to the methods set out above without undue difficulty.

The embodiments of the invention in which an exclusive property or right is claimed are defined as follows:

1. A method for constructing a semiconductor device at an outer major surface of a first layer of semiconductor material of a first conductivity type, said method comprising:

providing a first diffusant at a selected area of said outer major surface, said first diffusant being of a kind tending to cause said first layer to be locally of a second conductivity type when diffused therein;

providing a first insulative layer on said outer major surface with an opening in said first insulative layer to provide a first exposure of a portion of said selected area;

providing a second diffusant at said opening with i) said second diffusant being of a kind tending to cause said first layer to be locally of said first conductivity type when diffused therein, ii) said second diffusant, as provided, being of a kind to substantially diffuse behind said first diffusant, as provided, when simultaneously diffused therewith inwardly into said first layer, and iii) said second diffusant, as provided, being of a kind capable of limiting progress of a diffusion of said first diffusant, as provided, along directions substantially perpendicular to said outer major surface where said second diffusant is simultaneously diffused along said directions in sufficiently close proximity to said first diffusant, relative to progress of said diffusion of said first diffusant where said second diffusant is relatively remote from said diffusion of said first diffusant; and diffusing said first and second diffusants simultaneously into said first layer whereby a diffused device results having a region of said second conductivity type that is substantially narrowed on either side thereof where interposed between two regions of said first conductivity type.

2. The method of claim 1 wherein said outer major surface is oriented in substantially a (100) orientation.

3. The method of claim 2 wherein said providing of said first diffusant is accomplished by diffusing said first diffusant shallowly into said first layer through said selected area in an initial diffusion.

4. The method of claim 3 wherein said first diffusant is boron which is diffused substantially uniformly and said first layer is silicon.

5. The method of claim 1 wherein said providing of said first diffusant is accomplished by diffusing said first diffusant shallowly into said first layer through said selected area in an initial diffusion.

6. The method of claim 5 wherein said first diffusant is boron which is diffused substantially uniformly.

7. A method for constructing a semiconductor device at an outer major surface of a first layer of semiconductor material of a first conductivity type, said method comprising:

providing a first diffusant at a selected area of said outer major surface, said first diffusant being of a kind tending to cause said first layer to be locally of a second conductivity type when diffused therein;

providing a first insulative layer on said outer major surface with an opening in said first insulative layer to provide a first exposure of a portion of said selected area;

providing a second diffusant at said opening by depositing doped polysilicon on said major outer surface at said first exposure, said doped polysilicon being doped with said second diffusant, with i) said second diffusant being of a kind tending to cause said first layer to be locally of said first conductivity type when diffused therein, ii) said second diffusant, as provided, being of a kind to substantially diffuse behind said first diffusant, as provided, when simultaneously diffused therewith inwardly into said first layer, and iii) said second diffusant, as provided, being of a kind capable of limiting progress of a diffusion of said first diffusant, as provided, along directions substantially perpendicular to said outer major surface where said second diffusant is simultaneously diffused along said directions in sufficiently close proximity to said first diffusant, relative to progress of said diffusion of said first diffusant where said second diffusant is relatively remote from said diffusion of said first diffusant; and diffusing said first and second diffusants simultaneously into said first layer whereby a diffused device results having a region of said second conductivity type that is substantially narrowed on either side thereof where interposed between two regions of said first conductivity type.

8. The method of claim 7 wherein said diffusing of said first and second diffusants simultaneously is followed by:

providing a second insulative layer substantially on said first insulative layer, said second insulative layer being of a kind capable of being melted at temperatures and within time durations sufficiently small to prevent significant altering of said diffused device;

melting and resolidifying said second insulative layer; and depositing metal on said second insulative layer whereby an interconnection network is provided with first means to electrically contact said doped polysilicon located at said first exposure and with second means to electrically contact said outer major surface at a second exposure thereof provided through another opening in said first insulative layer and through an opening in said second insulative layer, said second exposure located within said selected area.

9. The method of claim 8 wherein said providing of said first diffusant is accomplished by diffusing said first diffusant shallowly into said first layer through said selected area in an initial diffusion and said outer major surface is oriented in substantially a (100) orientation.

10. The method of claim 9 wherein said second diffusant is arsenic and said first layer is silicon.

11. The method of claim 10 wherein said first insulative layer is silicon dioxide and said second insulative layer is phosphorus doped silicon dioxide.

12. The method of claim 7 wherein said diffusing of said first and second diffusants simultaneously is followed by:

providing a colloidal dispersion substantially on said first insulative layer, said colloidal dispersion having a first insulating material dispersed in a liquid dispersive medium and being capable of adhering to said first insulative layer and to said doped polysilicon, evaporating said liquid dispersive medium to provide a film of said first insulating material substantially on said first insulating layer, depositing a second insulating material on said film whereby a second insulative layer comprising said film and said second insulating material as deposited is provided, and depositing metal on said second insulative layer whereby an interconnection network is provided with first means to electrically contact said doped polysilicon located at said first exposure and with second means to electrically contact said outer major surface at a second exposure thereof provided through another opening in said first insulative layer and through an opening in said second insulative layer, said second exposure located within said selected area.

13. The method of claim 12 wherein said providing of said first diffusant is accomplished by diffusing said first diffusant shallowly into said first layer through said selected area in an initial diffusion and said outer major surface is oriented in substantially a (100) orientation.

14. The method of claim 4 wherein said second diffusant is arsenic and said first layer is silicon.

15. The method of claim 14 wherein said first insulative layer is silicon dioxide and said liquid dispersive medium is alcohol and said first and second insulating materials are silicon dioxide.

16. The method of claim 15 wherein said silicon dioxide is doped with phosphorus.

17. The method of claim 7 wherein said second diffusant is arsenic.

18. A method for constructing a semiconductor device at an outer major surface of a first layer of silicon of a first conductivity type, said method comprising:

providing a first diffusant at a selected area of said outer major surface, said first diffusant being of a kind tending to cause said first layer to be locally of a second conductivity type when diffused therein;

providing a first insulative layer on said outer major surface with an opening in said first insulative layer to provide a first exposure of a portion of said selected area;

providing arsenic as a second diffusant at said opening with i) said second diffusant as provided being of a kind to substantially diffuse behind said first diffusant, as provided, when simultaneously diffused therewith inwardly into said first layer, and ii) said second diffusant, as provided, being of a kind capable of limiting progress of a diffusion of said first diffusant, as provided along directions substantially perpendicular to said outer major surface where said second diffusant is simultaneously diffused along said directions in sufficiently close proximity to said first diffusant, relative to progress of said diffusion of said first diffusant where said second diffusant is relatively remote from said diffusion of said first diffusant; and diffusing said first and second diffusants simultaneously into said first layer whereby a diffused device results having a region of said second conductivity type that is substantially narrowed on either side thereof where interposed between two regions of said first conductivity type.

19. The method of claim 18 wherein said outer major surface is oriented in substantially a (100 ) orientation.

20. The method of claim 1 wherein said providing of said first diffusant is accomplished by providing boron and said first layer is silicon.

21. The method of claim 20 wherein said outer major surface is oriented in substantially a (100 ) orientation.

22. A method for constructing a semiconductor device at an outer major surface of a first layer of semiconductor material of a first conductivity type, said method comprising:

providing a first diffusant at a selected area of said outer major surface, said first diffusant being of a kind tending to cause said first layer to be locally of a second conductivity type when diffused therein;

providing a first insulative layer on said outer major surface with an opening in said first insulative layer to provide a first exposure of a portion of said selected area;

providing a second diffusant at said opening with i) said second diffusant being of a kind tending to cause said first layer to be locally of said first conductivity type when diffused therein; ii) said second diffusant, as provided, being of a kind to substantially diffuse behind said first diffusant, as provided, when simultaneously diffused therewith inwardly into said first layer, and iii) said second diffusant, as provided, being of a kind capable of limiting progress of a diffusion of said first diffusant, as provided, along directions substantially perpendicular to said outer major surface where said second diffusant is simultaneously diffused along said directions in sufficiently close proximity to said first diffusant, relative to progress of said diffusion of said first diffusant where said second diffusant is relatively remote from said diffusion of said first diffusant;

diffusing said first and second diffusants simultaneously into said first layer whereby a diffused device results having a region of said second conductivity type that is substantially narrowed on either side thereof where interposed between two regions of said first conductivity type;

providing a colloidal dispersion substantially on said first insulative layer, said colloidal dispersion having a first insulating material dispersed in a liquid dispersive medium and being capable of adhering to said first insulative layer, evaporating said liquid dispersive medium to provide a film of said first insulating material substantially on said first insulating layer, depositing a second insulating material on said film whereby a second insulative layer comprising said film and said second insulating material as deposited is provided, and depositing metal on said second insulative layer whereby an interconnection network is provided with first means to electrically contact said doped polysilicon located at said first exposure and with second means to electrically contact said outer major surface at a second exposure thereof provided through another opening in said first insulative layer and through an opening in said second insulative layer, said second exposure located within said selected area.

23. A method for constructing a semiconductor device at an outer major surface of a first layer of n type conductivity semiconductor material, said method comprising:

providing boron shallowly beneath a selected area of said outer major surface substantially uniformly across said selected area;

providing a first insulative layer on said outer major surface with an opening in said first insulative layer provided to provide a first exposure of a portion of said selected area;

providing said arsenic at said opening; and diffusing said boron and said arsenic simultaneously into said first layer whereby a diffused device results having a region of p type conductivity that is substantially narrowed on either side thereof where interposed between two regions of said n type conductivity.

24. The method of claim 23 wherein said outer major surface is oriented in substantially a (100) orientation and said first layer is silicon.

25. The method of claim 23 wherein said providing of said boron is accomplished by diffusing said boron shallowly into said first layer through said selected area in an initial diffusion.

26. The method of claim 25 wherein said outer major surface is oriented substantially in a (100) orientation and said first layer is silicon.

27. The method of claim 23 wherein said providing of said arsenic is accomplished by depositing doped polysilicon on said outer major surface at said first exposure, said doped polysilicon being doped with arsenic.

28. The method of claim 27 wherein said outer major surface is oriented in substantially a (100) orientation and said first layer is silicon.

29. The method of claim 28 wherein said providing of said boron is accomplished by diffusing said boron shallowly into said first layer through said selected area in an initial diffusion.

30. The method of claim 27 wherein said diffusing of said boron and said arsenic simultaneously is followed by:

providing a second insulative layer through depositing phosphorus doped silicon dioxide substantially on said first insulative layer;

melting and resolidifying said second insulative layer; and depositing metal subsequently on said second insulative layer whereby an interconnection network is provided with first means to electrically contact said doped polysilicon located at said first exposure and with second means to electrically contact said outer major surface at a second exposure thereof provided through another opening in said first insulative layer and through an opening in said second insulative layer, said second exposure located within said slected area.

31. The method of claim 30 wherein said providing of said boron is accomplished by diffusing said boron shallowly into said first layer through said selected area in an initial diffusion and said outer major surface is oriented in substantially a (100) orientation with said first layer being silicon.

32. The method of claim 31 wherein said providing of said first insulative layer is accomplished by depositing silicon dioxide.

33. The method of claim 32 wherein said diffusing of said boron and said arsenic simultaneously is accompanied by growing thermally a layer of silicon dioxide on said doped polysilicon for use as a mask in subsequent removal of portions of said doped polysilicon; and said diffusing of said boron and said arsenic simultaneously is followed removing a portion of said silicon dioxide thermally grown to expose a portion of said doped polysilicon, removing said portion exposed of said doped polysilicon and thereafter removing remaining said silicon dioxide thermally grown.

34. The method of claim 27 wherein said diffusing of said boron and said arsenic simultaneously is followed by:

providing a colloidal dispersion substantially on said first insulative layer, said colloidal dispersion having a first insulating material dispersed in a liquid dispersive medium and being capable of adhering to said first insulative layer and to said doped polysilicon, evaporating said liquid dispersive medium to provide a film of said first insulating material substantially on said first insulating layer, depositing a second insulating material on said film whereby a second insulative layer comprising said film and said second insulating material as deposited is provided, and depositing metal on said second insulative layer whereby an interconnection network is provided with first means to electrically contact said doped polysilicon located at said first exposure and with second means to electrically contact said outer major surface at a second exposure thereof provided through another opening in said first insulative layer and through an opening in said second insulative layer, said second exposure located within said selected area.

35. The method of claim 34 wherein said providing of said boron is accomplished by diffusing said boron shallowly into said first layer through said selected area in an initial diffusion and said outer major surface is oriented in substantially a (100) orientation with said first layer being silicon.

36. The method of claim 35 wherein said providing of said first insulative layer is accomplished by depositing silicon dioxide.

37. The method of claim 36 wherein said diffusing of said boron and said arsenic simultaneously is accompanied by growing thermally a layer of silicon dioxide on said doped polysilicon for use as a mask in subsequent removal of portions of said doped polysilicon; and said diffusing of said boron and said arsenic simultaneously is followed by removing a portion of said silicon dioxide thermally grown to expose a portion of said doped polysilicon, removing said portion exposed of said doped polysilicon and thereafter removing remaining said silicon dioxide thermally grown.

38. The method of claim 23 wherein said diffusing of said boron and said arsenic simultaneously is followed by:

providing a colloidal dispersion substantially on said first insulative layer, said colloidal dispersion having a first insulating material dispersed in a liquid dispersive medium and being capable of adhering to said first insulative layer, evaporating said liquid dispersive medium to provide a film of said first insulating material substantially on said first insulating layer, depositing a second insulating material on said film whereby a second insulative layer comprising said film and said second insulating material as deposited is provided, and depositing metal on said second insulative layer whereby an interconnection network is provided with first means to electrically contact said doped polysilicon located at said first exposure and with second means to electrically contact said outer major surface at a second exposure thereof provided through another opening in said first insulative layer and through an opening in said second insulative layer, said second exposure located within said selected area.

* * * * *

UNITED STATES PATENT OFFICE
CERTIFICATE OF CORRECTION

Patent No. 3,915,767 Dated October 28, 1975

Inventor(s) Lawrence C. Welliver

It is certified that error appears in the above-identified patent and that said Letters Patent are hereby corrected as shown below:

Column 2, line 20, after "as" delete "in" and insert -- is --. Column 5, line 9, after "$10^{21}$" delete "atmos" and insert -- atoms --. Column 6, line 21, delete "chosed." and insert -- chosen. --. Column 9, line 49, "1" should read -- 10 --.

Signed and Sealed this

*eleventh* Day of *May 1976*

[SEAL]

*Attest:*

RUTH C. MASON
*Attesting Officer*

C. MARSHALL DANN
*Commissioner of Patents and Trademarks*